(12) United States Patent
Dannels et al.

(10) Patent No.: US 7,646,199 B2
(45) Date of Patent: Jan. 12, 2010

(54) INTEGRATED SYSTEM OF MRI RF LOOP COILS PLUS SPACING FIXTURES WITH BIOCONTAINMENT USES

(75) Inventors: Wayne R. Dannels, Mentor, OH (US); Chun Jiang Xiao, Richmond Heights, OH (US); Robert C. Gauss, Aurora, OH (US); John T. Carlon, Madison, OH (US); David L. Foxall, Mentor, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 157 days.

(21) Appl. No.: 11/845,827

(22) Filed: Aug. 28, 2007

(65) Prior Publication Data
US 2008/0211498 A1    Sep. 4, 2008

Related U.S. Application Data

(63) Continuation of application No. PCT/US07/70560, filed on Jun. 7, 2007.

(60) Provisional application No. 60/804,321, filed on Jun. 9, 2006.

(51) Int. Cl.
*G01V 3/00* (2006.01)
*A61B 5/055* (2006.01)

(52) U.S. Cl. ................. 324/318; 324/309; 324/307; 600/410; 600/422

(58) Field of Classification Search ......... 324/300–322, 324/200; 600/410, 411, 422
See application file for complete search history.

(56) References Cited

U.S. PATENT DOCUMENTS 5,143,688 A * 9/1992 Mansfield ............ 324/318

(Continued)

FOREIGN PATENT DOCUMENTS

DE    1566654    8/1970

(Continued)

OTHER PUBLICATIONS

De Souza, N. M., et al.; A Solid Reusable Endorectal Receiver Coil for Magnetic Resonance Imaging of the Prostate: Design, Use, and Comparison with an Inflatable Endorectal Coil; 1996; JMRI; 6(5)801-804.

(Continued)

*Primary Examiner*—Brij B. Shrivastav
*Assistant Examiner*—Tiffany A Fetzner

(57) ABSTRACT

When scanning a patient to generate an image thereof, radio frequency (RF) coil modules are scalably coupled to each other using a plurality of clips to form flat or polygonal coil arrays that are placed on or around the patient or a portion thereof. A user assesses the volume to be imaged, identifies a coil array configuration of suitable size and shape and employs clips of one or more pre-determined angles to construct the identified coil array configuration, which is placed on or about the volume. Coil modules are coupled to a preamplifier interface box (PIB), which provides preamplified coil signal(s) to a patient imaging device, such as an MRI scanner. Small arrays are constructible to accommodate pediatric patients and/or smaller animals. Modules are hermetically sealed, can be sanitized between uses, and discarded at end-of-life. In one aspect, the modular coil array, clips, and PIB are maintained in an isolated contamination zone, separate from the patient imaging device.

24 Claims, 10 Drawing Sheets

U.S. PATENT DOCUMENTS

| | | | |
|---|---|---|---|
| 5,905,378 A | 5/1999 | Giaquinto et al. | |
| 6,498,489 B1 | 12/2002 | Vij | |
| 6,501,980 B1 | 12/2002 | Carlon et al. | |
| 6,591,128 B1 | 7/2003 | Wu et al. | |
| 7,449,886 B2 * | 11/2008 | Buchwald | 324/311 |
| 2002/0180442 A1 | 12/2002 | Vij | |
| 2004/0199072 A1 * | 10/2004 | Sprouse et al. | 600/424 |
| 2004/0231137 A1 | 11/2004 | Seeber | |
| 2006/0103386 A1 * | 5/2006 | Buchwald | 324/322 |
| 2007/0016003 A1 * | 1/2007 | Piron et al. | 600/415 |
| 2008/0007250 A1 * | 1/2008 | Wiggins | 324/200 |
| 2008/0081988 A1 * | 4/2008 | Biglieri et al. | 600/410 |
| 2008/0211498 A1 * | 9/2008 | Dannels et al. | 324/309 |
| 2008/0238424 A1 * | 10/2008 | Possanzini | 324/318 |

FOREIGN PATENT DOCUMENTS

| | | |
|---|---|---|
| DE | 19639975 C1 | 5/1998 |
| DE | 10049414 A1 | 5/2002 |
| DE | 102004007427 A1 | 9/2005 |
| DE | 102004008343 A1 | 9/2005 |
| EP | 0753758 A1 | 1/1997 |
| EP | 1255119 A2 | 11/2002 |
| EP | 1521094 A1 | 4/2005 |
| JP | 06181907 A | 7/1994 |
| WO | 03025607 A1 | 3/2003 |
| WO | 2005052621 A1 | 6/2005 |
| WO | 2005109010 A2 | 11/2005 |

OTHER PUBLICATIONS

De Zanche, et al. "16-Channel Interface Boxes for Adaptable MRI Array Systems", Proc. Intl. Soc. Mag. Reson. Med. 14 (2006) p. 2030.

* cited by examiner

INTEGRATED SYSTEM OF MRI RF LOOP COILS PLUS SPACING FIXTURES WITH BIOCONTAINMENT USES

CROSS REFERENCE TO RELATED APPLICATIONS

This application is a Continuation of PCT/US07/70560 filed Jun. 7, 2007 which claims the benefit of U.S. provisional application Ser. No. 60/804,321 filed Jun. 9, 2006, the subject of which is incorporated herein by reference.

This invention was made with Government support under grant no. N01-A0-60001 awarded by the National Institute of Health (NIH). The Government has certain rights in this invention.

BACKGROUND

The present application finds particular application in patient imaging systems, particularly involving patient imaging devices used in conjunction with biocontainment and decontamination protocols. However, it will be appreciated that the described technique may also find application in other patient imaging systems, other biocontainment scenarios, or imaging techniques.

Magnetic resonance (MR) device manufacturers and third party MR coil suppliers have traditionally underserved the need to scan pediatric subjects. Such scanning is routinely performed making the best use of coils designed for adult use. These generally do not fit the subjects comfortably, require an expert technician to pad and fit the coil to the subject, and produce sub-optimal signal-to-noise ratio for the higher resolution imaging on small subjects. The problem has been viewed as intractable, because many coil variations in different sizes would be needed to fit children of different ages and sizes. The cost to develop and qualify a set of such coils is high, therefore the cost to the end customer is also high and the pediatric scanning market represents an orphan medical need. Further, the storage space for a large number of differently-sized coils at the MRI site is problematic.

Simple coils such as single loop planar conductor patterns have been long used in MR. Use of more than one loop coil in arrays is also known. Composite arrays that are pre-built into an integrated multi-element coil are known, and have been the standard commercial offering for the last 10 years or so. More often, these arrays are used to receive signal detection only, and other coils are used to perform the transmit function. A pre-built array is acceptable for a known anatomy and size, but it can be less than optimal for subject anatomies of other sizes, and may be completely incompatible when larger anatomies or larger subjects cannot fit into it. Existing pre-built arrays are not easily extensible, so providing new capabilities for different subjects can require an entire design cycle to make a new product. Each new configuration is often expensive to design and manufacture, and expensive to the end customer. This leaves the customer waiting for new designs, and once they become available, the customer bears the burden of purchasing the new pre-built array, storing it when it is not in use, learning any new unique performance characteristics or limitations, etc. Existing pre-built arrays are generally not suitable for rigorous decontamination, as would occur in the application of imaging or researching infectious disease.

Surface coils that are strapped to the patient are also known. Similarly, garments with built-in flexible coils have been proposed.

The present application provides new and improved scalable coil array construction systems and methods, which overcome the above-referenced problems and others.

SUMMARY

In accordance with one aspect, a modular coil array system includes a plurality of radio frequency (RF) receive coil modules, a plurality of rigid clips that connect the coil modules to form the modular coil array, and an interface box that is connected to each of the plurality of coil modules, amplifies signals received from the coil modules, and outputs the amplified signals to a patient imaging device.

In accordance with another aspect, a method of configuring a modular coil array includes determining a size of a volume to be imaged, selecting a coil array configuration to accommodate the volume to be imaged, and connecting coil modules using clips to achieve the selected coil array configuration. The method further includes placing the coil array on or around the volume to be imaged, and imaging the volume.

One advantage is that the coil array modules are hermetically sealed for ease of sanitization.

Another advantage resides in the scalability of the coil arrays for differently sized subjects.

Still further advantages of the subject innovation will be appreciated by those of ordinary skill in the art upon reading and understand the following detailed description.

DRAWINGS

The innovation may take form in various components and arrangements of components, and in various steps and arrangements of steps. The drawings are only for purposes of illustrating various aspects and are not to be construed as limiting the invention.

DESCRIPTION

Figure 1:
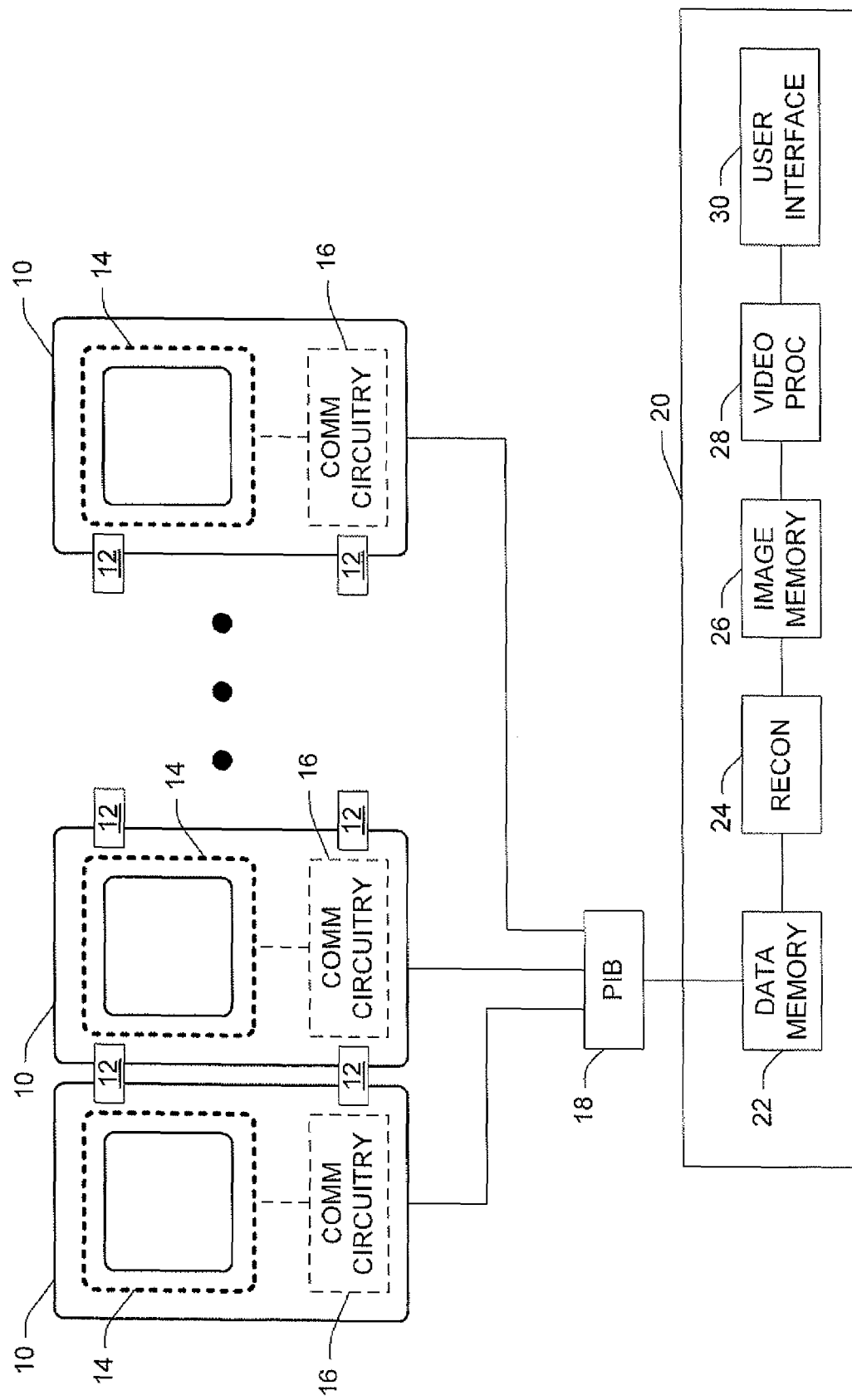
FIG. 1 illustrates rigid, semi-deposable radio frequency (RF) receive coil module, which is employed in a configurable coil array for magnetic resonance imaging of a subject.

FIG. 1 illustrates rigid, semi-deposable radio frequency (RF) receive coil module 10, which is employed in a configurable coil array for magnetic resonance imaging of a subject. The modules are suitable for a wide range of anatomies on a wide range of animals and humans of different sizes. For instance, the modules can be formed into custom geometries suitable, for example, for pediatric subject imaging, animal studies, or the like. The modules can be disposed of at end-of-life or at any time that the potential contamination thereof warrants disposal. Each of a plurality of modules 10 can be connected using pre-formed clips 12 that permit a user to generate a coil array of a desired shape for a given subject. Each module includes a loop coil 14 and circuitry 16 for communicating information to a preamplifier interface box (PIB) 18 over communication link (e.g., an RF communication cable or the like). Matching and tuning elements are incorporated into the loop and/or the circuitry 16. The modules are sealed and have connectors which are designed to reduce ingress or capture of biological contaminants and/or volatile decontamination liquids and gases. The modules are thus constructed with materials that can withstand chemical attack from aggressive cleaning and decontamination chemicals. Additionally, although the modules are described herein as being flat and comprising a loop coil, it will be appreciated that one or more of the modules may be curved, butterfly-shaped, saddle-shaped, and/or may comprise a quadrature surface coil or the like.

In one embodiment, resonance signals received by the array of modules are demodulated in the PIB 18 and communicated to a patient imaging device 20, such as an MRI machine or the like, which stores received information to a data memory 22. In other embodiments, the PIB 18 includes preamplifiers for respective coils and interface board (not shown) that sends separate MR signals for each coil channel to the patient imaging device 20, where they are demodulated, digitized, processed into images, etc. A reconstruction or array processor 24 performs a two- or three-dimensional inverse Fourier transform, or other known transform, to reconstruct a slice or volumetric image representation that is stored in an image memory 26. A video processor 28, which may be under operator control, converts selected portions of the volumetric image representation into slice images, projection images, perspective views, or the like for display on a user interface 30 (e.g., a workstation or other computing device with a monitor or the like). The module array geometries can additionally be optimized according to one or more constraints in terms of any of several criteria, such some aggregate signal-to-noise measure, or independent and decoupled field patterns between the coils, or final image quality associated with sensitivity encoding or other parallel imaging techniques.

According to an embodiment, a coil kit includes a plurality of the modules 10, coil clips 12, the PIB 18, and associated cables, to permit a user to create custom-sized receiver arrays for scanning subjects of varying sizes (e.g., pediatric subjects, obese subjects, other animals, etc.). The improved signal-to-noise ratio (SNR) obtained by using arrays constructed of small loops (e.g., approximately 10 cm in diameter) allows scanning down to approximately 100 micrometers per pixel, if desired. According to an example, the custom receiver coil arrays have four to eight coils and permit sensitivity encoding (SENSE™) acceleration in conjunction with constant level appearance (CLEAR™) uniformity corrections, both of which are registered trademarks of, and described in one or more patents to, Koninklijke Philips Electronics, NV. According to another example, coil modules with varied loop sizes are provided, in order to permit a user to select smaller coils loop size when desirable to increase SNR. In any case, the PIB has ports to accommodate a number of modules 10 (e.g., 6, 8, 16, etc.), and multiple PIBs can be stacked to provide scalability to the scanning system.

The kit can be employed, for instance, in a highly contaminated environment. For example, the coil modules, clips, and PIB(s) can remain in a sectioned-off area (e.g., using heavy-duty plastic, air filtration systems, etc.) that is considered contaminated, and a patient (e.g., dog, child, monkey, etc.) can be scanned using an array constructed from the modules and clips. The modules are actively decoupled to improve signals received by a respective PIB. A communication cable from the PIB traverses a barrier between the contaminated area and clean area in which the MRI scanner machine, and potentially a user, is located, to permit communication there between. Once the patient has been scanned, the modules, clips, and optionally the PIB can be sanitized (e.g., sprayed, dipped in solution, etc.) for subsequent use on another contaminated patient by one or more personnel in biohazard suits. At end-of-life, the modules and clips can be autoclaved and discarded.

The modules in the kit are clipped together using the clips to form custom geometric shapes, and each module is plugged into the PIB. The clips hold the modules in rigid shapes, and can be used to fasten the coils together end-to-end, side-by-side, or both. Fixed clips 12 with angles of, for example, 180°, 135°, 120°, 108°, 90°, or any other suitable or desired angle can be employed to form different geometries. Additionally, the clips 12 can be color-coded to permit a user to quickly distinguish there between. Clips can be molded of polyethylene or the like, which is relatively inexpensive and easy to clean. According to another embodiment, clips are identified using labels positioned underneath clear polycarbonate or the like, such that the label is embedded in the clip surface, which is kept smooth to mitigate cross-contamination. Alternatively, fiberglass ink or the like is used to print clip angle information on the clip.

The PIB is a multiple channel coil interface box that provides coil-to-coil decoupling, coil-to-transmit coil decoupling, signal preamplification, and an interface to a multiple channel receiver system. In an example, the module array is used in a scanner for operation in a Biohazard Level 4 (BL4) laboratory working with medium to large sized primate subjects and deadly pathogens. The modules can be considered disposable if desired, are sealed to biological contamination, sterilizable, and able to provide complete coverage of the primate anatomy. A medium sized primate has about the same size and physiological parameters (heart rate, breath rate) as a human one-year old. The basic design of the coil and clip kit described above can provide a large number of custom receiver arrays, with only a small number of parts, making it suitable, for instance, for pediatric scanning. The cost of the whole kit is comparable to a single adult sized coil, yet can easily provide all sizes of receiver arrays to scan children from birth to five years of age or older. In other embodiments, one or more kits may be employed to construct a coil array large enough to scan an obese adult who may not fit properly into a standard MRI coil. In other examples, the modules are used for MRI scanning in field hospitals or the like, as an ad hoc MRI scanner.

In another embodiment, the modules are clipped together to form a table-top planar receiver coil comprising multiple quadrature surface coil modules, and other modules are connected in a geometry that forms receiver array sections that fit over a patient. Additionally, the modules can be constructed in different housings with longer loops or multiple overlapped loops for enhanced Z axis coverage. Scanning with the modular coil array can be further enhanced by making use of the SENSE and CLEAR reconstruction features built into a scanner. The rigid clips allow the arrays to function well with parallel imaging applications.

In yet another embodiment, the modules 10 are placed into a pre-constructed frame, rather than clipped together, in a desired geometry for a particular imaging application (e.g., small animal, child, adult, etc.). For instance, a frame can be generated to fit around or over a specific subject or a portion thereof, and a number of coil modules can be inserted into the frame to create a rigid scanning coil array about the subject.

Frames and/or clips can be provided to cover a range of volumes, such as regular polygons in cross section, the polygon being the base of a 3D (right) parallelepiped with increasing total area and increasing numbers of sides, each "side" of the polygon being a single coil element. According to an example, frames and/or clips can be provided to construct two "ladder" arrays, one anterior and one posterior, to a supine subject. Additionally or alternatively, frames and/or clips can be provided for a 2D windowpane, such as a 2×3 array or 2×4 which is nominally planar, and the array structure controls overlap of the coils to establish minimal coupling.

In any case, coil arrays can be built such that some criterion of high quality imaging performance is optimized. For instance, an 8-module cylindrical head coil array can be built such that its coil-to-coil signal coupling is nominally minimized. Additionally or alternatively, it can be built such that its receive spatial non-uniformity is no worse than a target of 50% over a volume such as, for instance, a 10 cm sphere. Still furthermore, it can be built to minimize SENSE imaging degradation, such as a g-factor with imaging accelerations of 2.0 and 3.0 along either the horizontal or vertical directions.

Other features and aspects include employing the modules 10 singly or in combination without the clips 12. Array geometry may also be selected to achieve minimal coil coupling, maximal uniformity over a volume, minimal artifact imaging with SENSE or other parallel imaging techniques, etc. The individual modules may be disposable or replaceable. Polygonal arrays may have offsets or overlaps like a pinwheel. Modules can be shifted to be less symmetrical relative to each other, as this can reduce artifacts in SENSE. Additionally, the PIB 18 allows several independent modules to be connected to an MRI scanner at a single interface, which would conventionally support a single connection of a multiple-element coil.

It will be appreciated that the modules 10 need not be flat, but rather can be curved in one or two planes to facilitate conforming to a particular volume to be imaged. Further, the modules 10 need not be rectangular, but may be triangular, hexagonal, etc., and need not be of the same size. Additionally, clips 12 can be shaped to accommodate such curved modules. In other embodiments, clips have variable or varied length, which facilitates selectably spacing the modules. In still other embodiments, preamplifier circuitry is included in the circuitry 16 of each module rather than in the PIB 18.

Figure 2:
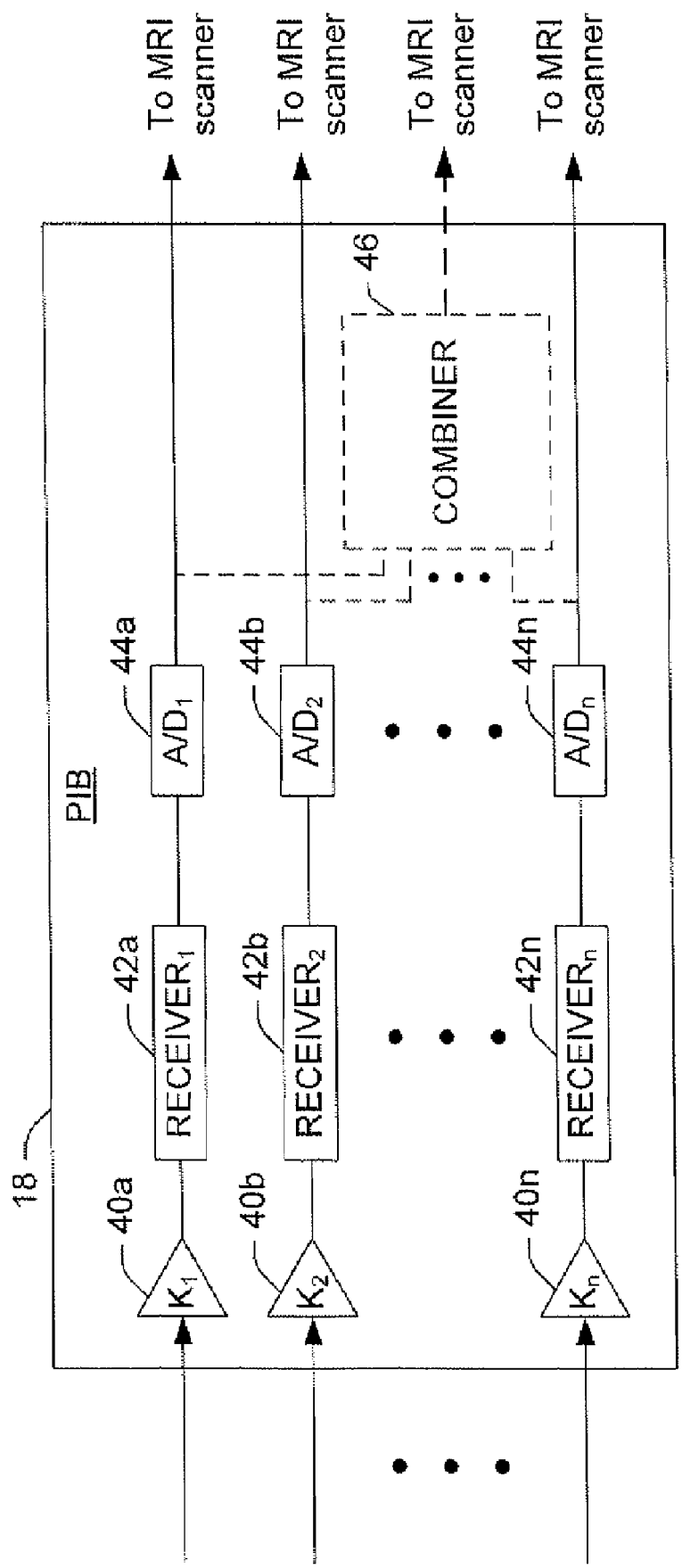
FIG. 2 is an illustration of a preamplifier interface box (PIB) to which multiple coil modules can be connected, which optionally combines signals received from the modules for output to an MRI scanner.

FIG. 2 is an illustration of the PIB 18 to which multiple coil modules can be connected, which optionally combines signals received from the modules to output to an MRI scanner. According to an example, the PIB can provide the electronics for anywhere from 1 to 8 channels, including preamps, impedance matching circuitry, drive circuitry for transmit/receive biasing of the individual coils, detection of electrical fault conditions, and identification of its presence to a main MRI system. The PIB can have caps or covers to reduce exposure of substances onto unused connectors. Placing preamps in the PIB, rather than in the modules 10, facilitates reducing cost, size, thickness, etc., of the modules. The modules can then be treated as disposable entities, if desired. However, the modules are sealed and designed without rough surfaces or deep indentations that can harbor contaminants, and can be built to survive many decontamination cycles if desired.

Referring still to FIG. 2, a signal from each of n individual RF coil modules 10 in a coil array is amplified by a corresponding one of n individual preamplifiers $40, 40b, \ldots, 40n$, where n is the accomodatable number of receiver coil modules in the array. The individual amplified signals are demodulated by n individual receivers $42a, 42b, \ldots, 42n$ and fed to an array of A/D converters including n individual A/D converters $44a, 44b, \ldots, 44n$. Optionally, a digital combiner 46 processes, weights, and combines the individual digital signals using standard digital signal processing techniques. An operator can also control the combiner 46 to divide the signals to be reconstructed to a plurality of related images. Alternatively, the signals from the coils can be digitized and then demodulated with digital receivers. In another embodiment, some or all of the individual digital signals are forwarded directly to the MRI scanner, without being combined, where they are demodulated, digitized, and processed into images. For instance, in this embodiment, SENSE reference data is stored at the scanner and is employed to reconstruct the MR signals into image data. Additionally, the individual signals can be sent separately, multiplexed, etc.

The number of receiving channels depends on the particular MRI system and thus, it will be recognized that it is not necessary that the number of receiver channels be equal to the number of RF coil modules. For example, the signals from a plurality of modules can be multiplexed or otherwise combined in analog or digital fashion with appropriate combining circuitry as necessary in light of the number of receiver channels available on the imaging system employed. Also, all channels need not be used.

Figure 3:
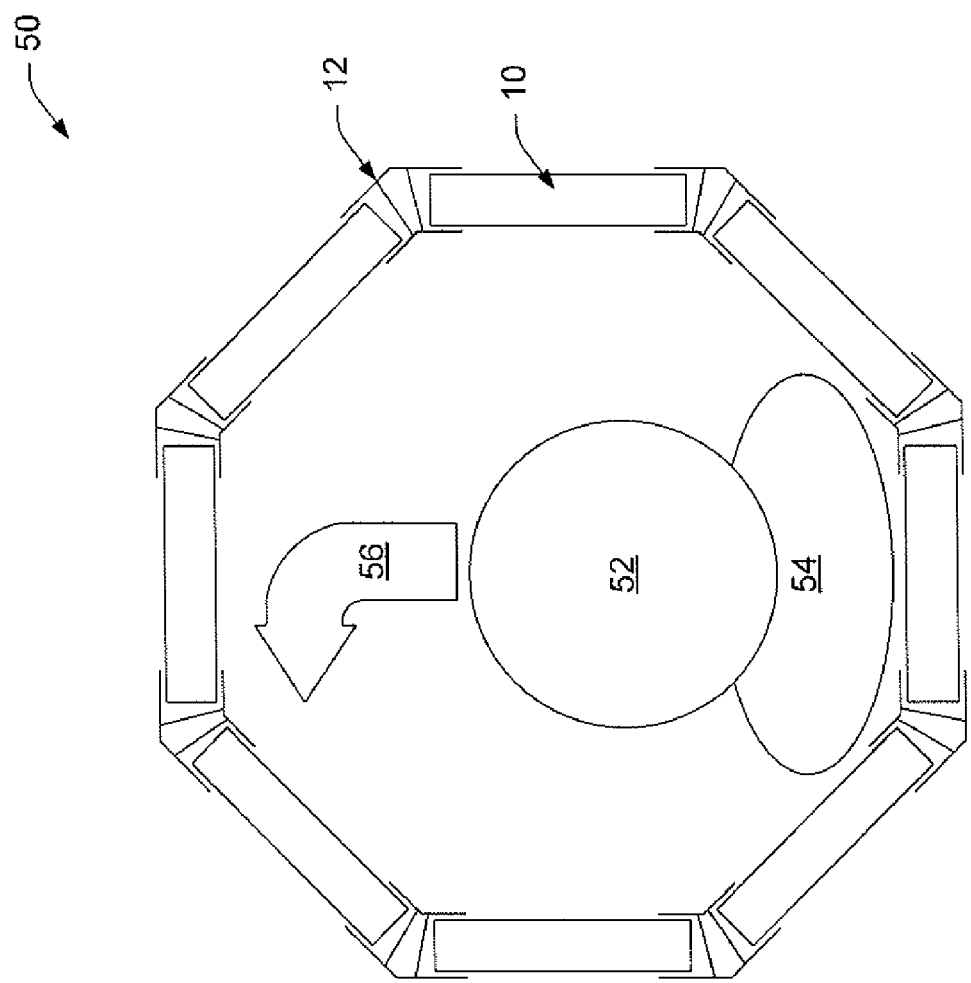
FIG. 3 shows an embodiment of the connectable coil modules arranged in an octagonal array, rigidly coupled using the clips.

FIG. 3 shows an embodiment of the connectable coil modules 10 arranged in an octagonal array 50, rigidly coupled using the clips 12. According to the figure, the clips have a 135° angle that facilitates arranging eight modules into a symmetrical 8-sided octagonal geometry. However, it is to be appreciated that any number of rigid clip angles can be provided to permit any number of geometries to be constructed. Additionally, the clips 12 can be color-coded to permit a user to quickly distinguish between clips of slightly different angles (e.g., 108° and 120° clips, etc.)

A volume of interest 52 rests on a support 54 (e.g., a pad, beanbag, pillow, or some other support) within the constructed array 50. According to an example, the volume of interest is a patient's head or other animal's head. The octagonal shape of the array provides additional space for other medical paraphernalia, such as a respirator 56 or the like positioned over the patients mouth and nose, etc. The array 50 is suitable for a SENSE imaging protocol or the like.

Figure 4:
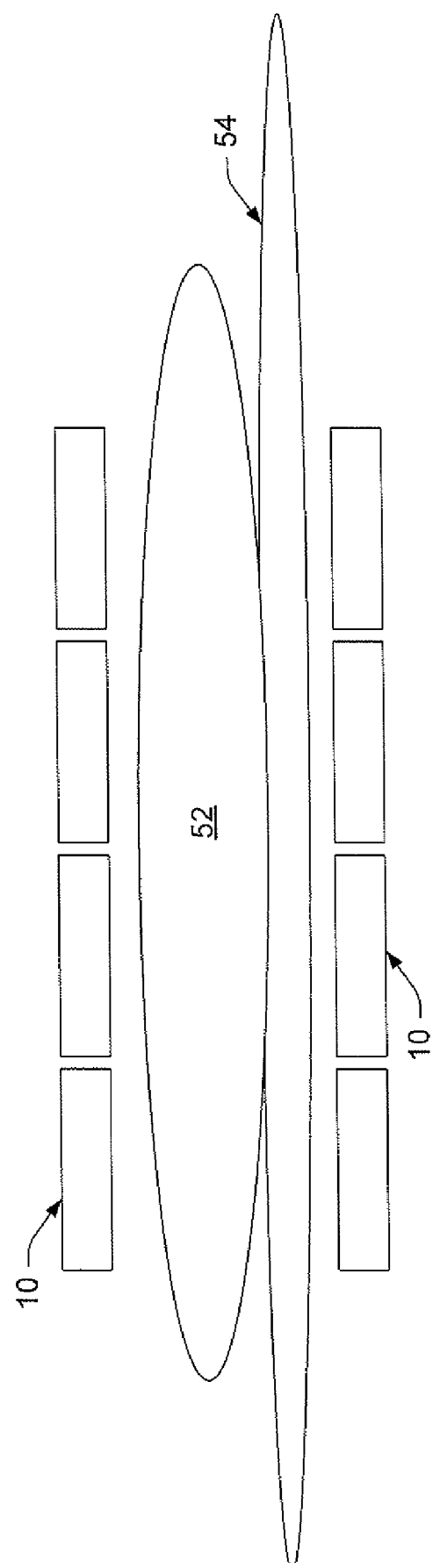
FIG. 4 illustrates another embodiment of an array of coil modules for a volume of interest, such as a subject's torso, resting on a support.

FIG. 4 illustrates another embodiment of an array of coil modules 10 for a volume of interest 52, such as a subject's torso, resting on a support 54. In this example, coil modules 10 can be selected from a variety of module sizes, and each module is tuned to a nominal resonance frequency of a scanner, such as under nominal loading conditions that may be representative of use on a subject. According to the figure, 4 elements form a "ladder" geometry below the subject, and 4 elements form a ladder positioned above the body of the subject, with the subject lying prone or supine between the two ladders, on the support. According to another example, an array can include approximately four modules in a square (e.g., a 2×2 array), for use above or below the torso of the subject. Furthermore, more than one such "torso square" might be used at the same time (e.g. one above the subject, and one below).

Figure 5:
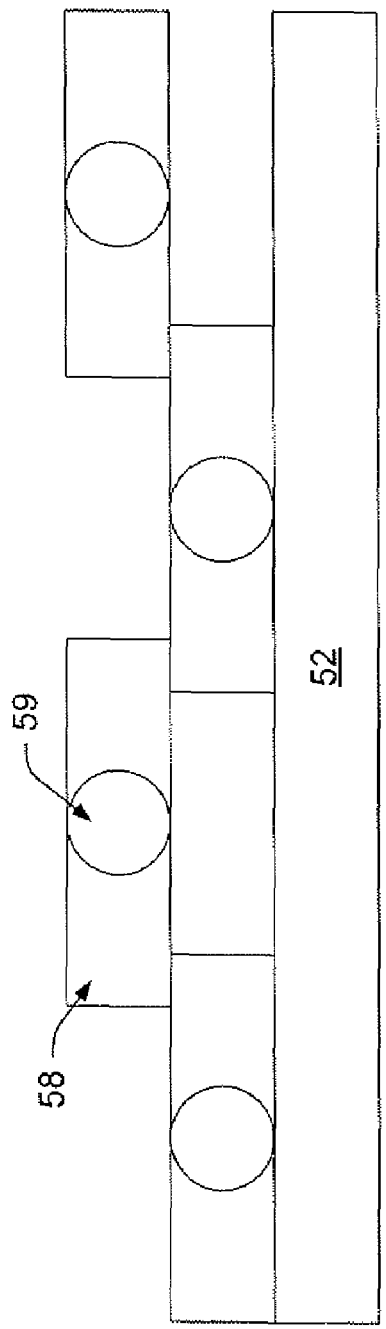
FIGS. 5 and 6 illustrate end views of a ladder array of overlapped coil modules having modules with thick-ended housings and modules with thin-ended housings, respectively.
Figure 6:
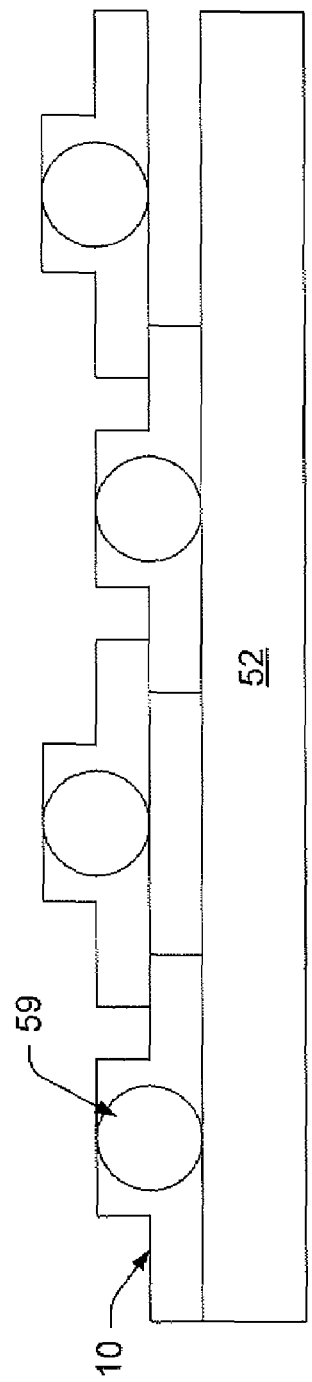

FIGS. 5 and 6 illustrate end views of a ladder array of overlapped coil modules having modules 58 with thick-ended housings and modules 10 with thin-ended housings, respectively. The conductors and/or circuit board 16, which comprises a majority of the module is thin, having a thickness on the order of a few millimeters, but some electronic components and/or some connectors may be substantially thicker (e.g., 1 to 2 centimeters). For example, a cable 59 extending out of each of the depicted modules is illustrated as a thickness-limiting component. Thus, a simple housing with the thickness of the widest component (e.g., cable 59 in this example) may be employed as in module 58.

Alternatively, the housing may be built with one or more edges which are thin, and with other more central portions having a greater thickness, as shown with regard to the module 10 in FIG. 6. According to this embodiment, each coil housing is thin to facilitate overlap of coils, if desired. Each coil module 10 is made with materials that can stand up to volatile chemicals, such as are used to sterilize the modules between uses. Materials such as Ultem (polyetherimide), PEEK (Polyetheretherketone) PPSF (Polyphenylsulfone), polycarbonates, and the like can be used to form the modules. Each module housing is kept free of deep recesses, sharp grooves, or sharp interior angles, to reduce the likelihood of pathogens or chemicals become entrapped therein. The electrical connector 59 can be at least nominally sealed, for example with an o-ring or with bonding material used in sealing the body of the connector against the module housing. Electrical contacts can be selected from metals that are less chemically reactive, such as electroless nickel or the like, to better survive contact with decontamination chemicals.

Figure 7:
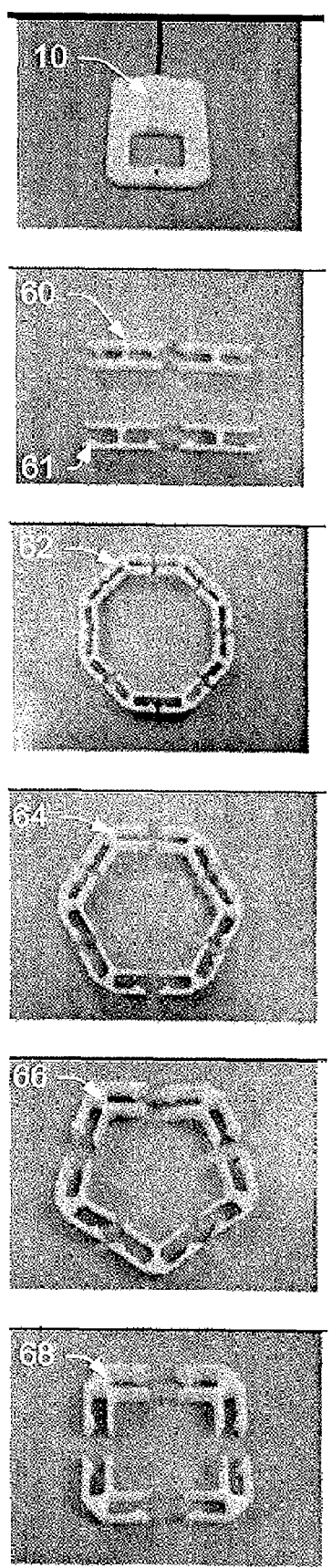
FIG. 7 illustrates a plurality of clips that are employable to form a variety of geometries from a plurality of RF receiver coil modules.

FIG. 7 illustrates a plurality of clips that are employed to form a variety of geometries from a plurality of RF receiver coil modules 10. The clips are provided in a number of pre-formed configurations to facilitate connecting the modules to form a rigid structure. A 180° clip 60 can be employed to connect two modules in a substantially flat orientation. Each clip, regardless of its angle, includes a pair of retaining bumps 61 that fit into corresponding receiving grooves (not shown) on the module 10. A 135° clip 62 is provided for connecting modules at 135° angles. For example, an octagonal coil array is formed when eight modules are connected using eight 135° clips 62.

If a hexagonal array is desired, 120° clips 64 can be employed to connect the modules. Similarly, a pentagonal array is formed using five 108° clips 66. A square array is formed using 90° clips 68. It will be appreciated that other polygonal shapes can be formed using different clips in combination with each other. According to another embodiment, the clips can be semi-rigidly hinged to permit dynamic shaping of a polygon, such that a number of modules can be connected together and the resulting array can be manipulated or folded into a desired shape, with the hinges sufficiently stiff or lockable to retain the final shape of the array.

Figure 8:
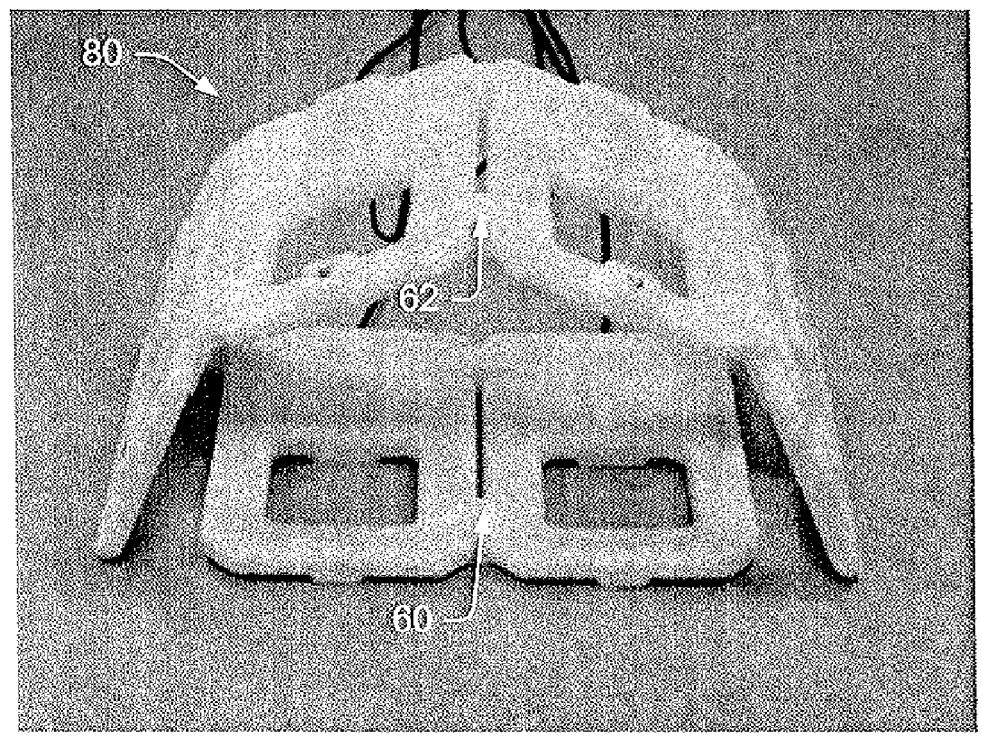
FIG. 8 illustrates a split-top style receiver array using a plurality of modules connected by 180° clips and 135° clips.

FIG. 8 illustrates a split-top style receiver array 80 using a plurality of modules connected by 180° clips 60 and 135° clips 62. According to the figure, a flat panel of modules is formed by connecting two modules using the 180° clips 60. This portion of the array 80 can be placed underneath a subject, such as a human or other primate. Additionally, the flat panel array portion is configurable such that it can be oriented to have a long axis that is parallel or orthogonal to the main magnetic field used to scan the subject. Several other modules are connected using 135° clips 62, to form a curved portion of the array that is placed over, for instance, a thorax or abdomen of the subject. In this manner, the array 80 is generated to fit closely to the subject or volume of interest in order to generate a highly accurate reading. Each of the modules can be connected to a PIB, and any unused ports on the PIB can be terminated in 50 Ohms to complete the array.

Figure 9:
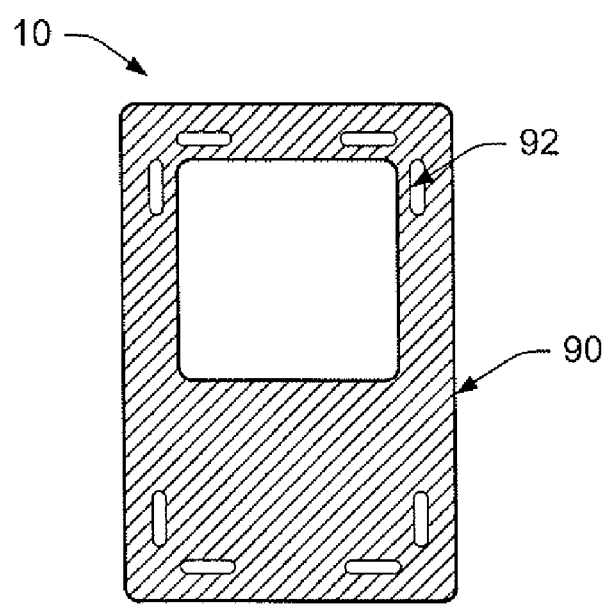
FIG. 9 illustrates a module with a housing that includes receiving grooves for receiving rigid clips.

FIG. 9 illustrates a module 10 with a housing 90 that includes receiving grooves or recesses 92 for receiving rigid clips. The module includes two receiving grooves on each edge in order to permit connecting the module, along any desired edge, to another module. The receiving grooves 92 are designed to receive the retaining bump 61 as described above with regard to FIG. 7, in order to form a secure and removable mechanical junction between the clip(s) and module(s). The receiving grooves 92 are deep enough to accommodate the retaining bumps, but shallow enough to mitigate residue or contaminant retention therein. Additionally, the grooves are formed in the housing in a manner that mitigates sharp edged, which facilitates cleaning and/or sanitation of the module after use. For instance, the grooves and/or housing can be molded of a suitable polymer or plastic. In one embodiment, the housing is molded in two pieces, and the coil loop and associated circuitry are inserted before sealing the two pieces together.

Figure 10:
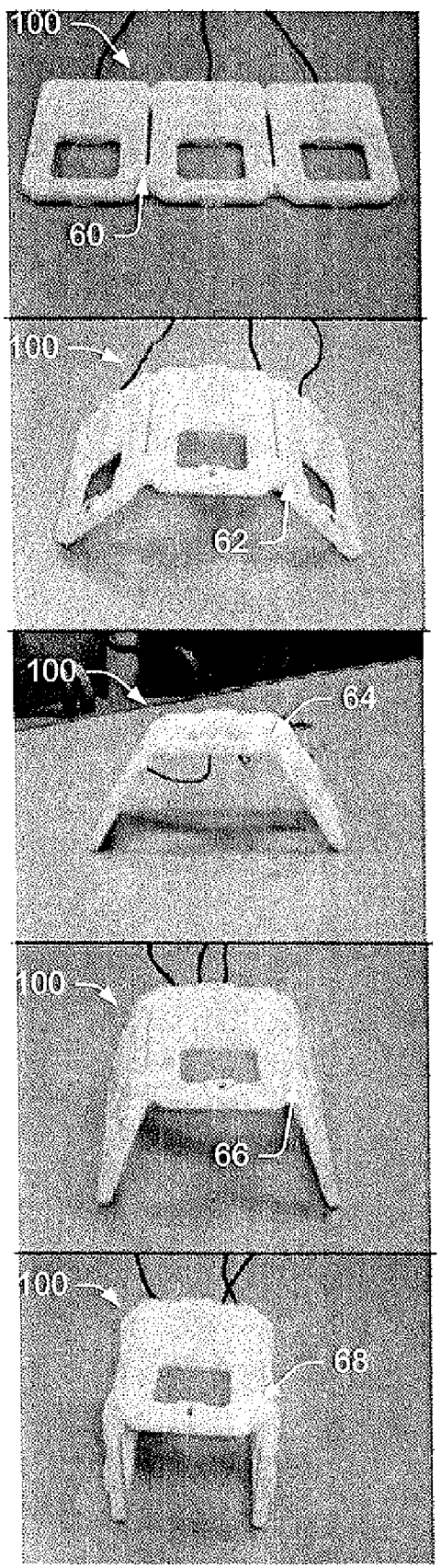
FIG. 10 illustrates a three-coil array in a variety of configurations using different clips, in accordance with various aspects.

FIG. 10 illustrates a three-coil array 100 in a variety of configurations using different clips, in accordance with various aspects. For instance, the array 100 can be connected in a flat arrangement using 180° clips 60, which can be used as a surface coil panel, a primate spine array, or the like. In another embodiment, the array is constructed using 135° clips 62 to form a slightly arched formation, which can be used as a primate body array, a surface coil panel, etc. Another embodiment uses 120° clips 64 to form half of a hexagonal array, which is used, for instance, as a surface coil panel, an open-faced primate head coil array, or the like. Still another example uses 108° clips 66 to form an open-faced array that can be used as a surface coil panel, a rodent thoracic array, an open-face primate head coil array, etc. Yet another example uses 90° clips 68, which can be used as an open-faced rodent array, an open-face primate head array, a surface coil panel, or the like.

Figure 11:
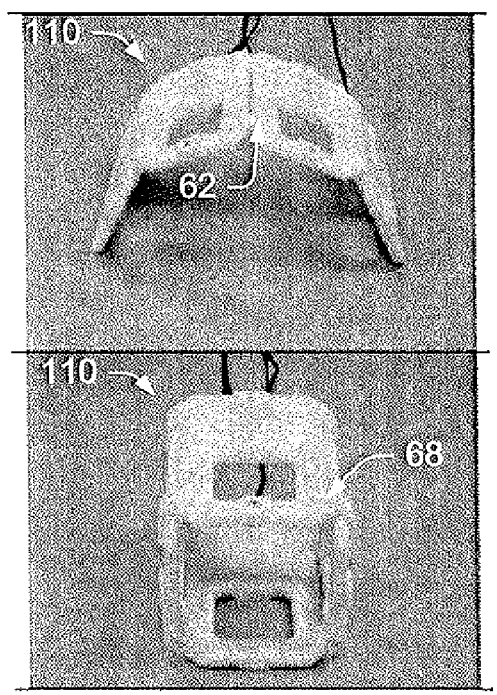
FIG. 11 illustrates a four-coil array constructed using a variety of clips, in accordance with different aspects.

FIG. 11 illustrates a four-coil array 110 constructed using a variety of clips, in accordance with different aspects. The four-coil array is illustrated, in one example, as constructed with 135.degree. clips 62 to form half of an octagonal array, which can be used as a surface coil panel, a primate torso array, etc.,. According to another example, the four-coil array is connected using 90.degree. clips 68 to form a substantially square array that can be used as a primate limb coil array, a rodent volume coil array, etc.,.

Figure 12:
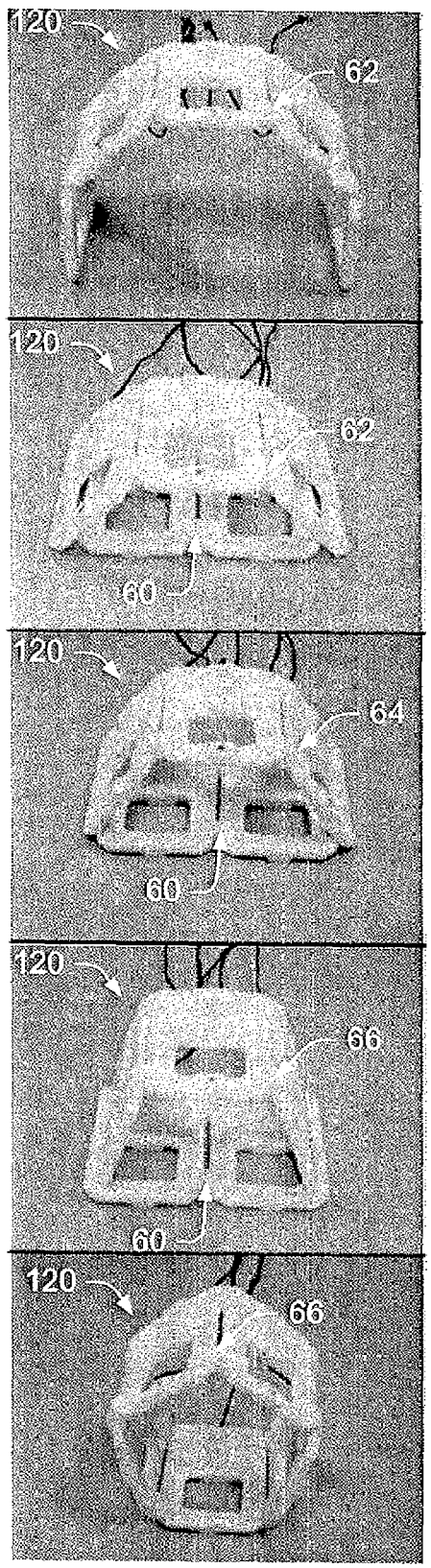
FIG. 12 illustrates a five-coil array in different orientations using a variety of clips, in accordance with various features.

FIG. 12 illustrates a five-coil array 120 in different orientations using a variety of clips, in accordance with various features. For instance, the five-coil array can be connected using 135° clips 62 to construct an array that may be used, for example as a large animal torso coil array or the like. According to another example three coil modules can be clipped together using 135° clips 62, and two other coils can be clipped together using 180° clips 60 to generate a split-top primate torso coil array. Another example uses three modules clipped together using 120° clips 64 and two modules connected using 180° clips to form a split-top coil array that can be used, for instance, to scan a primate head or torso. Yet another example uses 108° degree clips 66 to connect three modules, and 180° clips 60 to connect two other modules to form a split-top coil array. Still another example relates to connecting five modules using 108° clips 66 to form a pentagonal coil array.

Figure 13:
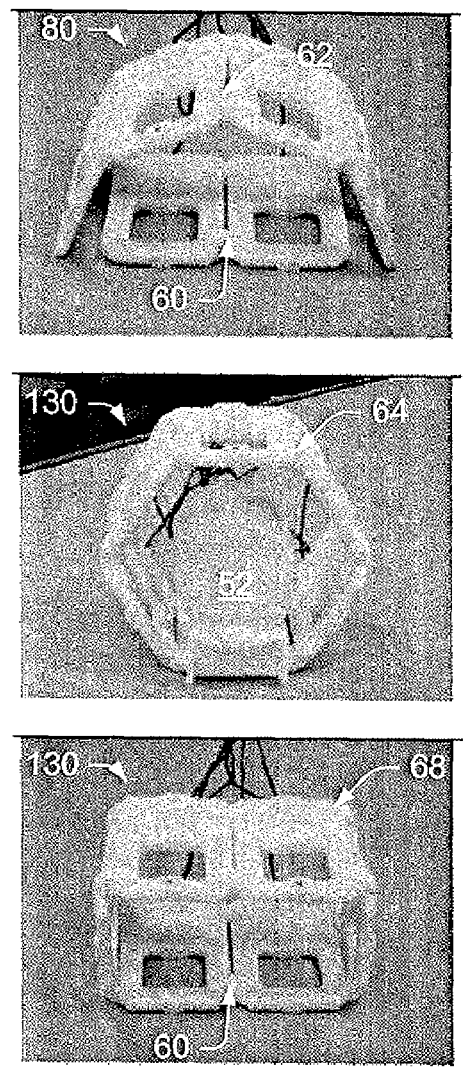
FIG. 13 illustrates several examples of a six-coil array constructed using different clips in accordance with features described herein.

FIG. 13 illustrates several examples of a six-coil array 80, 130 constructed using different clips in accordance with features described herein. The six-coil array can be constructed as a split-top coil array using 135° clips and 108° clips. Alternatively, a hexagonal coil array can be generated using 120° clips. According to another example, a rectangular array can be constructed using a combination of 180° clips and 90° clips. Such array structures can be employed when scanning, for example, a primate body or a portion thereof.

It will be understood that the arrays described above can be constructed using any of the clips described herein as well as any combination thereof, and any number of modules. Moreover, the uses for the arrays are not limited to the examples described above, but rather the arrays can be used for any application or any volume of interest that can be bounded or otherwise imaged by the arrays. Additionally any number of suitable or desired array configurations can be constructed using any number of coil modules, and such configurations are not limited to the specific array configurations described herein.

Figure 14:
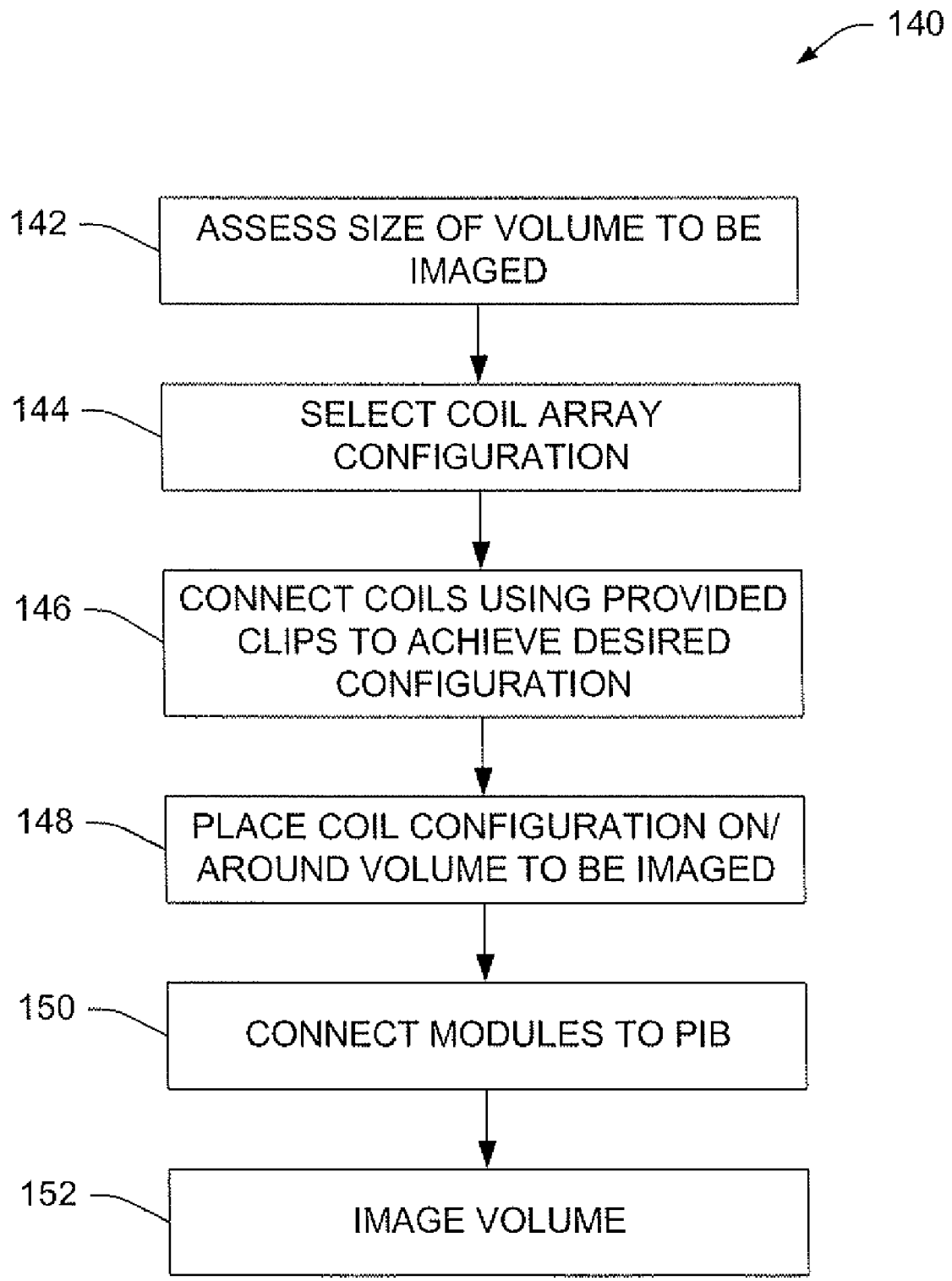
FIG. 14 is an illustration of a method for constructing a custom RF receive coil array, in accordance with various features.

FIG. 14 illustrates a method related to custom generation of a coil array, in accordance with various features. While the methods are described as a series of acts, it will be understood that not all acts may be required to achieve the described goals and/or outcomes, and that some acts may, in accordance with certain aspects, be performed in an order different than the specific orders described.

FIG. 14 is an illustration of a method 140 for constructing a custom RF receive coil array, in accordance with various features. At 142, a size of a volume to be imaged is assessed. The volume can be, for instance, a human or other animal. Additionally or alternatively, the volume can be a portion of the human or other animal, such as a head, torso (e.g., thorax and/or abdomen), leg, arm, joint, hand, foot, etc. At 144, a coil array configuration that will encompass the volume is selected. According to an example, if the volume is a patient's hand, a four-module array can be selected for construction with 90° clips. Alternatively, a four-module array can be selected for construction as a split-top array, wherein two modules are connected using 180° clips to create a flat panel array over which the patient's hand is placed, and two other modules are connected using 135° clips to create the top of the split-top array for placement over the patient's hand.

At 146, the coil modules are connected using provided clips to construct the selected coil array configuration. For instance, if the volume is a patient's head, and a hexagonal array was selected at 144, then six coil modules can be clipped together using 120° clips to construct the array. At 148, the coil array configuration is placed on or about the volume. The individual modules are connected (e.g., via cable or other communication means) to a PIB, which in turn is coupled to a scanner, such as an MRI scanner, at 150. The volume is then imaged at 152.

In another embodiment, the clips used to connect the modules together in a desired configuration are adjustable. For instance, the clips can be provided with a variable hinge that permits a user to select from a plurality of angles to facilitate adjustably constructing the coil array. In this scenario, the clip is adjustable along a continuous arc (e.g., from approximately 270° to approximately 90°, from approximately 180° to approximately 90°, or between some other range). Clip hinges can be provided with a cylindrical O-ring (e.g., of rubber, plastic, or other polymer capable of resisting corrosion due to decontamination chemicals) or other means of maintaining a relatively high static friction within the hinge to ensure that the hinged clip stays at a selected angle once positioned at the selected angle, while the amount of force exerted when adjusting the hinged clip is consistent with that which can be provided by a human hand. In this example, the O-ring can be sealed within the adjustable clip to ensure that the clip is not easily contaminated. Another embodiment relates to an adjustable clip that has an internal ratchet or gear or the like, with a plurality of discrete selectable positions. Moreover, clips can be lockable in a selected position.

The invention claimed is:

1. A multiply configurable modular coil array system, compatible with magnetic resonance imaging of a subject including:
    a plurality of radio frequency (RF) receive coil modules;
    a plurality of rigid clips that releasably connect and retain the coil modules in a final shape in order to form custom geometries and permit dynamic shaping of differently configured modular coil arrays; and
    an interface box that is connected to each of the plurality of coil modules, which amplifies signals received from each of the coil modules, and outputs the amplified signals into a patient imaging device.

2. The system according to claim 1, wherein each coil module includes an RF receive coil and circuitry communicating with the interface box.

3. The system according to claim 2, wherein the patient imaging device is a magnetic resonance imaging (MRI) device, which executes algorithms performing sensitivity encoding (SENSE) acceleration and constant level appearance (CLEAR) uniformity corrections on signals received from the interface box.

4. The system according to claim 1, wherein the rigid clips are reusable, and include at least two 90° clips, 108° clips, 120° clips, 135° clips, or 180° clips, such that the reusable rigid clips are use to reconfigure the coil modules into an array of differently configured module arrays.

5. The system according to claim 4, wherein the clips are color-coded in order to indicate their respective angles.

6. The system according to claim 4, wherein the clips connect the modules in order to form a polygonal coil array.

7. The system according to claim 4, wherein the coil modules are selectively connected:
    using 90° clips in order to form all or a portion of a square coil array;
    using 108° clips in order to form all or a portion of a pentagonal coil array;
    using 120° clips in order to form all or a portion of a hexagonal coil array;
    using 135° clips in order to form all or a portion of an octagonal coil array; or
    using 180° clips in order to form a flat coil array.

8. The system according to claim 1, wherein each of the coil modules are hermetically sealed.

9. The system according to claim 1, wherein the interface box includes a plurality of ports connecting to individual coil modules, and wherein a plurality of interface boxes are stackable in order to accommodate modular coil arrays having more coil modules than a single interface box alone can accommodate.

10. A magnetic resonance imaging system including the modular coil array system according to claim 1, configured and positioned in order to receive spatially encoded magnetic resonance RF signals.

11. A method of configuring the multiply configurable modular coil array system, of claim 1, including:
  selecting a size of a volume to be imaged;
  selecting a coil array configuration in order to fit the volume being imaged;
  connecting a plurality of coil modules using the rigid clips in order to achieve a selected modular coil array configuration;
  placing the modular coil array on or around the image volume; and
  imaging the volume with the modular coil array.

12. The multiply configurable modular coil array system of claim 1, further including
  a combiner that combines signals received from one or more coil modules and outputs a single signal into the patient imaging device.

13. A method for configuring a multiply configurable, rigid modular coil array, compatible with MRI imaging of a subject including:
  determining a size of a volume to be imaged;
  selecting a dynamically shaped, custom, or geometric rigid modular coil array configuration in order to accommodate the volume to be imaged, which coil array includes a plurality of coil modules at one or more selected angles relative to each other;
  from a plurality of reusable clips that connect and retain the plurality of coil modules at each of a plurality of angles, selecting clips corresponding to the selected angles;
  connecting the plurality of coil modules using the selected clips in order to achieve and retain the selected dynamically shaped, custom, or geometric modular coil array configuration;
  placing the coil array on or around the volume to be imaged; and
  imaging the volume with the rigid modular coil array in place.

14. The method according to claim 13, further including performing sensitivity encoding (SENSE) acceleration and constant level appearance (CLEAR) uniformity corrections on data generated by the plurality of coil modules in the coil array and reconstructed into an image representation.

15. The method according to claim 14, wherein the reusable clips include at least two of 90° clips, 108° clips, 120° clips, 135° clips, or 180° clips.

16. The method according to claim 13, further including:
  connecting each of the coil modules to an interface box;
  amplifying a signal from each coil module;
  performing an analog-to-digital conversion on each signal; and
  combining the amplified, converted signals into a single output signal configured for output to an MRI scanner.

17. The method according to claim 13, further including:
  connecting each of the coil modules to an interface box;
  amplifying a signal from each coil module;
  performing an analog-to-digital conversion on each signal; and
  providing the amplified, converted signals to an MRI scanner.

18. The method according to claim 17, further including:
  maintaining the rigid modular coil array and interface box in a contaminated area of a scanning zone; and
  maintaining the MRI scanner in a clean area of the scanning zone.

19. The method according to claim 18, further comprising sanitizing each of the coil modules and each of the clips that have been used between uses, and discarding the coil modules and clips at end-of-life.

20. The method according to claim 13, wherein the imaging the volume includes: receiving magnetic resonance signals induced by an MR scanner with the coil modules of the rigid modular coil array.

21. A processor or computer, containing a computer readable medium, which contains programmed instructions that when executed cause the processor or computer to perform the method of claim 14.

22. A multiply configurable modular coil system compatible with magnetic resonance imaging of a subject that facilitates constructing scalable RF coil arrays, including:
  a plurality of radiofrequency coil modules configured for collecting image data generated by applying an RF pulse in the presence of a magnetic field to a volume of interest;
  a plurality of fixed or adjustable angle clips, which releasably connect to and retain in a final shape, the plurality of radiofrequency coil modules configured for collecting image data in any of a plurality of configurations, wherein the clip connected modules are reconfigurable into each of the plurality of configurations by changing at least one of:
    the number of the plurality of clips;
    the type of clip, or
    the angle of the clips;
  means for receiving collected image information from the plurality of the releasably connected radiofrequency coil modules, which are retained in the final shape, during imaging of the volume of interest; and
  means for reconstructing an image of the volume of interest.

23. The multiply configurable modular coil system according to claim 22, wherein clips are pre-configured in order to connect adjacent coil modules at each of a plurality of fixed angles.

24. The multiply configurable modular coil system according to claim 23, wherein the plurality of clips includes clips angled in order to connect the plurality of the coil modules in each of at least;
  a rectangular array configuration;
  a hexagonal array configuration; and
  a flat array configuration.

* * * * *